US007757187B2

(12) United States Patent
Kheterpal et al.

(10) Patent No.: US 7,757,187 B2
(45) Date of Patent: Jul. 13, 2010

(54) METHOD FOR MAPPING A BOOLEAN LOGIC NETWORK TO A LIMITED SET OF APPLICATION-DOMAIN SPECIFIC LOGIC CELLS

(75) Inventors: Veerbhan Kheterpal, Sunnyvale, CA (US); Lawrence T. Pileggi, Pittsburgh, PA (US); Dipti Motiani, Santa Clara, CA (US)

(73) Assignee: PDF Solutions Inc., San Jose, CA (US)

( * ) Notice: Subject to any disclaimer, the term of this patent is extended or adjusted under 35 U.S.C. 154(b) by 467 days.

(21) Appl. No.: 11/627,930

(22) Filed: Jan. 26, 2007

(65) Prior Publication Data
US 2008/0163152 A1 Jul. 3, 2008

Related U.S. Application Data

(63) Continuation-in-part of application No. 11/619,587, filed on Jan. 3, 2007.

(60) Provisional application No. 60/883,332, filed on Jan. 3, 2007.

(51) Int. Cl.
*G06F 17/50* (2006.01)
(52) U.S. Cl. .................................. 716/1; 716/2; 716/18
(58) Field of Classification Search .............. 716/2, 716/18, 1
See application file for complete search history.

(56) References Cited

U.S. PATENT DOCUMENTS

| 6,295,636 | B1 * | 9/2001 | Dupenloup | 716/18 |
| 6,470,486 | B1 * | 10/2002 | Knapp | 716/18 |
| 6,519,609 | B1 * | 2/2003 | Touzet | 707/104.1 |
| 6,836,877 | B1 * | 12/2004 | Dupenloup | 716/18 |
| 6,958,545 | B2 | 10/2005 | Kotecha et al. | |
| 2003/0145288 | A1 * | 7/2003 | Wang et al. | 716/2 |
| 2003/0233628 | A1 * | 12/2003 | Rana et al. | 716/18 |
| 2006/0075375 | A1 * | 4/2006 | Rana et al. | 716/18 |
| 2007/0011643 | A1 * | 1/2007 | Wang et al. | 716/18 |
| 2008/0127000 | A1 * | 5/2008 | Majumder et al. | 716/2 |

OTHER PUBLICATIONS

Lehman et al., "Logic Decomposition During Technology Mapping"., *IEEE Trans. CAD*, 16(8), 1997, pp. 813-833.
Motiani, D., "Implementation Flow for Design Using Regular Fabric Logic Bricks", *Carnegie Mellon University whitepaper*, Aug. 2005, pp. 1-31.
Sentovich, E.M., et al., "SIS: A System for Sequential Circuit Synthesis", *white paper for Dept. of Elec. Engineering and Computer Sci.—Univ. CA at Berkeley*, May 4, 1992, pp. 8-16.

(Continued)

*Primary Examiner*—Jack Chiang
*Assistant Examiner*—Magid Y Dimyan
(74) *Attorney, Agent, or Firm*—Pillsbury Winthrop Shaw Pittman LLP

(57) ABSTRACT

A method and system is described for mapping a system-level description of an integrated system directly to a technology-specific set of logic cells that are comprised primarily of large complex cells (bricks). The invention is based on applying aggressive Boolean operations that would be of impractical runtime complexity for a large library, but are applicable for the targeted brick libraries which typically contain a small number of complex cells, along with a much smaller number of simple cells. This invention is modular such that it can be applied in the context of incremental netlist optimization as well as optimization during physical synthesis.

7 Claims, 5 Drawing Sheets

OTHER PUBLICATIONS

Keutzer, K., "DAGON: Technology Binding and Local Optimization", 24$^{th}$ ACM/IEEE Design Automation Conf., pp. 341-347 (1987).

Kukimoto, Y., et al., "Delay-Optimal Technology Mapping by DAG Covering", Whitepaper, pp. 348-351 (1998).

* cited by examiner

METHOD FOR MAPPING A BOOLEAN LOGIC NETWORK TO A LIMITED SET OF APPLICATION-DOMAIN SPECIFIC LOGIC CELLS

RELATED APPLICATIONS

This application is a continuation-in-part of U.S. patent application Ser. No. 11/619,587 filed Jan. 3, 2007 entitled "Method For The Definition Of A Library Of Application-Domain-Specific Logic Cells", and claims priority to U.S. Provisional Application No. 60/883,332 filed Jan. 3, 2007 entitled "A Method and System For Grouping Logic In An Integrated Circuit Design To Minimize Number Of Transistors And Number Of Unique Geometry Patterns," both of which are expressly incorporated by reference herein.

BACKGROUND OF THE INVENTION

1. Field of the Invention

The present invention is related to integrated circuit design, and, more particularly, a method and system for mapping a Boolean logic network to a limited set of application-domain specific logic cells.

2. Field of the Related Art

Typical integrated circuit design environments make use of libraries of pre-designed standard cells (a cell library) which usually consist of from 500 cells to more than 1,000 cells. These libraries are composed of a number of simple, generic and standard logic functions that have been implemented in a form suitable for manufacturing. Each standard cell is a representation, typically the mask level representation, of the circuit that performs the logic function for that cell.

The logic functions performed by the cells in a typical cell library are intentionally general purpose and basic and the majority of them represent common, low-level logic functions such as AND, OR, XOR, AND-OR-INVERT (AOI), Multiplexer, Adder, etc. These are functions are representative of patterns that are recognized by logic designers, and those that are used as the building blocks for manual logic design. Full custom logic design at the transistor level can sometimes include complex AOI functions that are identifiable from their logic description, such as:

$(\bar{a}+\bar{b})(c+d)$

But such functions are typically not included in standard cell libraries, and not representative of specific basic building blocks that are known to logic designers. Instead, they are more likely to be custom designed at the transistor level as an AOI gate.

In a typical integrated circuit (IC) design flow an IC design is translated to logic gates. In most cases this translation is performed by an automatic logic synthesis tool to derive a netlist based on a set of the aforementioned generic logic functions. This translation is often necessary as there are many different methods in common use for design specification. Those methods may include specification using a high-level programming language such as Verilog, VHDL or C or by manually entering schematics using a computer-aided design system.

As a high level language cannot be directly implemented into the physical layout of an integrated circuit, it is first converted to a gate level implementation. The result of the conversion is a representation of the design called a gate level netlist. This representation is usually in the form of simple logic functions such as NAND, NOR, etc. along with a representation of the connections between functions (the netlist).

Automatic logic synthesis tools are then generally used to bind a design to an implementation, based on a set of manufacturing technology specific logic cells from a cell library. The synthesis tool selects cells from the library based on a set of implementation goals that may include any combination of metrics related to area, performance or power and possibly manufacturing yield, to obtain a cell-based netlist. Logic synthesis, as is known, is generally the process of transformation of an RTL or a Boolean network such that its functionality is not altered into a form that is aligned for technology mapping.

Within the context of the conventional design flow as described above, techniques for optimization using regularity extraction have been proposed for designs dominated by datapaths, which are formed by a small number of repeating logic elements (or bit slices) that are interconnected in a very organized pattern, and other regular circuit structures including RAMs, PLAs, array multipliers etc. For such designs, identifying repeating regularity in circuits simplifies the effort required via synthesis, optimization and layout. However, such regularity extraction techniques rely on the assumption that the designs inherently have within them a high degree of regularity. For example, most of these techniques use information such as bus names and datapath features such as high-fanout control nets to identify repeating structures, such as bit slices. These techniques do not apply, therefore, to more general design flows and logic descriptions that are without such organization and repetition. Also, these techniques to identify repeating regularity do not modify the underlying structural or functional topology of the circuit, which further makes them ineffective for generalized logic and random logic applications.

In light of the above background, the typical commercial flow that is used in mapping a Boolean network to a set of technology-specific standard cell gates, is shown in FIG. 1. A Boolean network can be represented by a directed acyclic graph where each node is a Boolean function of one of three types: a primary input, internal, output. A Boolean network may not contain a directed cycle. Each internal node in a Boolean network represents a Boolean function of its fanins. A Boolean network may contain internal nodes with arbitrarily large number of fanins. The Boolean network is first decomposed into a subject graph (a graph which represents the design independent of a specific technology or library using simple logic primitives (most commonly AND and INV) to form the technology-independent netlist. Subsequently, the subject graph is then typically mapped to a cell library using structural/Boolean matching followed by binate covering against pre-stored patterns representing the cells in the library. As the cells in the library get more complex, the matching complexity increases exponentially. Moreover, this method suffers from a structure bias; i.e, the mapping quality is dependent on the subject graph structure which is often derived with little knowledge of the characteristics of the target cell library.

SUMMARY OF THE INVENTION

The present invention relates to mapping a Boolean logic network to a limited set of application-domain specific logic cells.

In one aspect, a method and system is described for mapping a system-level description of an integrated system directly to a technology-specific set of logic cells that are comprised primarily of large complex cells (bricks). The invention is based on applying aggressive Boolean operations that would be of impractical runtime complexity for a large library, but are applicable for the targeted brick libraries which typically contain a small number of complex cells, along with a much smaller number of simple cells. This invention is modular such that it can be applied in the context of incremental netlist optimization as well as optimization during physical synthesis.

In a particular aspect, there is described a method of mapping a behavioral, RTL or unmapped Boolean network to a small library of logic components to represent the network as different ones of the logic components that are connected together. The method includes obtaining the behavioral, RTL or unmapped Boolean network; identifying the small library of logic components, the small library of logic components including a set of complex functions and a set of simple functions, wherein the set of complex functions includes a plurality of non-standard complex Boolean logic functions and wherein substantially all of the plurality of non-standard complex Boolean logic functions each have at least three inputs, and wherein the set of simple logic functions, together with the set of complex functions, can together completely specify the network; and mapping the network to the small library of logic components using aggressive Boolean operations to obtain a mapped network, wherein the mapping includes directly mapping large functions from the network to different ones of the non-standard complex Boolean logic functions without the large functions from the network being decomposed, wherein most of the network is mapped to certain ones of the plurality of non-standard complex Boolean logic functions.

SUMMARY OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

Figure 1:
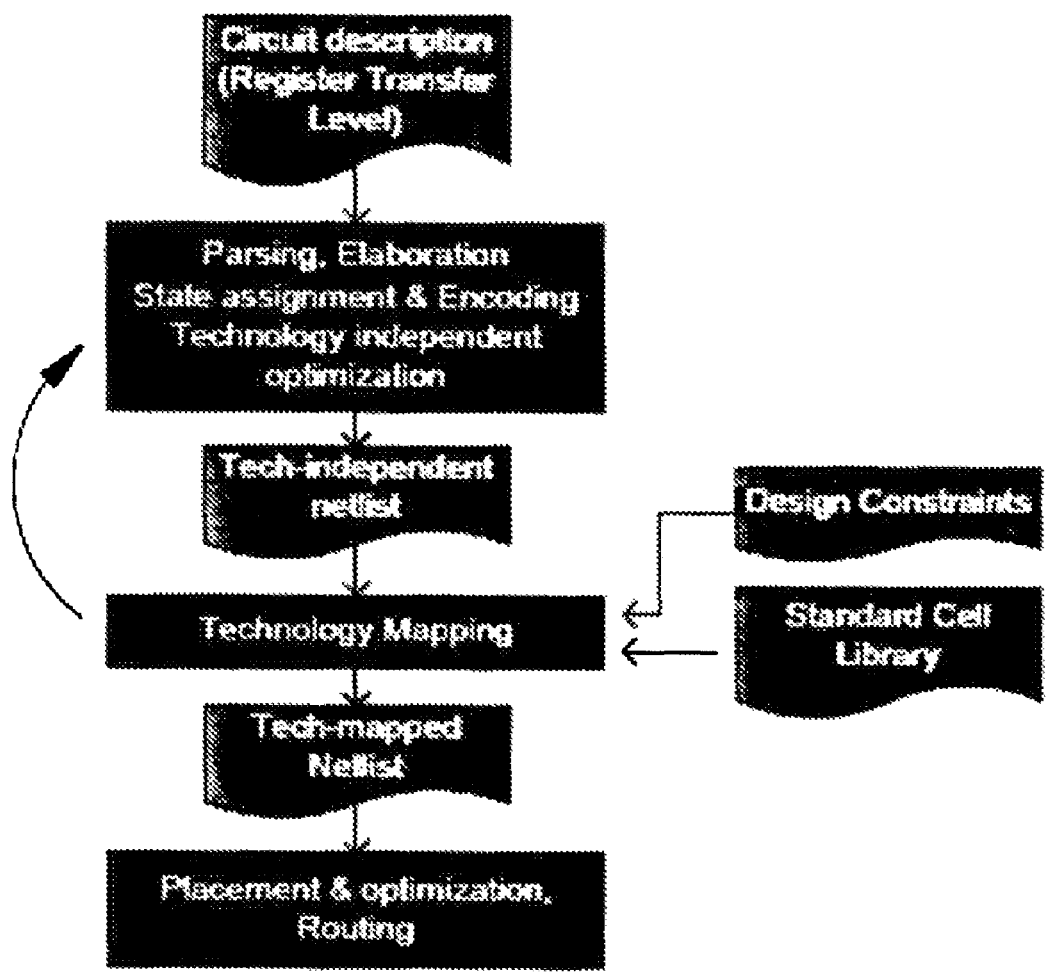
FIG. 1 illustrates a typical commercial flow that is used in mapping a Boolean network to a set of technology-specific standard cell gates.

A method and system are described to map a behavioral level (a functional description level for which the mapping to the final state machine is not specified. There is no description of how the variables map to circuit memory elements), RTL or system-level logic netlist to a small library of logic components (no fewer than 5 and no more than 50 unique logic functions). One intended application of this invention is to leverage the unique advantages offered by small libraries of application-domain specific logic bricks, such as described in U.S. application Ser. No. 11/619,587 filed Jan. 3, 2007 and entitled "Method For The Definition Of A Library Of Application-Domain-Specific Logic Cells," referred to previously.

IC design with increased regularity for manufacturabilty can incur a penalty in terms of area and performance. It is important, therefore, to exploit this regularity with circuits and methodologies that can overcome some or all of these penalties. Exploiting the large logic functions that are grouped for macro-regularity to maximize the logic utilization on the chip can provide a significant improvement in both area and performance. Improvements in IC area and performance are of great commercial value and all IC application domains. The present invention addresses this.

Specifically, this invention describes a logic synthesis method to map a behavioral, RTL or system-level logic netlist to a library that is primarily composed of bricks or large logic cells (typically having 6-12 inputs, with substantially all of the large logic cells having at least 3 inputs). Our method takes advantage of the property that the brick library has a small number of cells compared to typical commercial standard-cell libraries that can contain hundreds or thousands of cells, as described in the previously referenced application.

In contrast to the conventional commercial flow that is used in mapping a Boolean network to a set of technology-specific standard cell gates, the present invention starts by directly mapping a Boolean network onto a target library without any need for decomposition into a subject graph. Decomposition is the process of simplifying nodes by identifying and adding new Boolean nodes (with smaller number of fanins) to the network. In general, most decomposition algorithms work by choosing a factor and re-expressing the network in terms of that new factor and iterating until no new factors are found. This is achieved by direct decomposition of Boolean nodes into cells/bricks. Since a Boolean network can contain internal nodes with arbitrarily large number of fanins, the general method of decomposition attempts to simplify such nodes by identifying and adding new Boolean nodes (with smaller number of fanins) to the network. In general, the prior art for decomposition algorithms are based on choosing a factor and re-expressing the network in terms of that new factor and iterating until no new factors are found.

This general set of decomposition techniques for logic optimization and technology mapping (the process of transforming a circuit netlist into a network of interconnected components/cells of a given library. By means of technology mapping, a design can be targeted to a design style such as standard cells, FPGAs or gate arrays) have evolved with the development of standard cell-based design methodology. As a result, they are very specific to optimization of standard cells, and do not work well for large cells or bricks. The complexity of the cells in a brick library (also referred to as library that includes a set of complex functions includes a plurality of non-standard complex Boolean logic functions that are each derived from the identified logic function patterns of the recurring Boolean logic chains in the utility application incorporated by reference above) is considerably higher than those of typical standard cells, and the number of cells in a brick library (typically 5-50) is less than in a typical standard cell library (typically 700-2000). As described in more detail in the utility application incorporated by reference, efficiency with a small cell library is sometimes obtained by generating the library to be application specific, or application domain specific. Based on the outlined differences, existing methods used for binding a system level (e.g. RTL) description to a specific technology library are inefficient for brick libraries.

For example, the complexity of typical matching algorithms used during the matching stages of technology mapping grows exponentially with the number of inputs of the cells in the target technology library. A target technology library is one have a collection of cells that perform primitive Boolean logic functions in a specific technology or a design style. Further, logic decomposition and multi-level optimization are separate steps from technology mapping with very little interaction. Since a brick library has limited functionality, it provides for an opportunity to tightly couple these steps while having a tractable complexity of the computation. Although, there is work (see E. Lehman et al, "Logic decomposition during technology mapping", IEEE Trans. CAD, 16(8), 1997, pp. 813-833) that proposes a technique that combines algebraic decomposition with technology mapping, it is based on tree-matching onto a mapping graph, and thus suffers from structure bias. Further, the mapping graph does not scale with the size-complexity of Boolean functions, thereby making it impractical for application to libraries of bricks or large cells.

Figure 2:
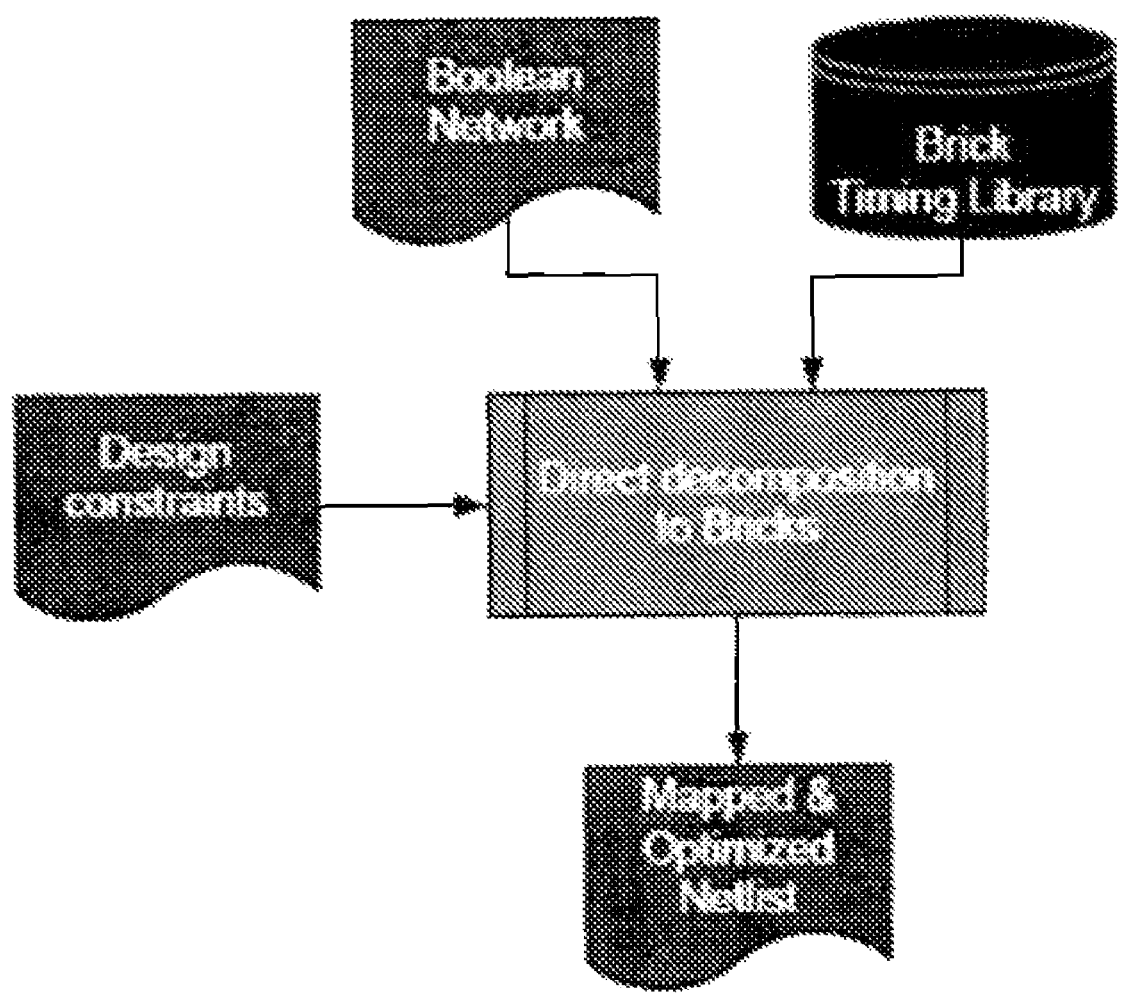
FIG. 2 illustrates an overview of the present invention.

FIG. 2 illustrates an overview of the present invention, which takes as inputs the Boolean network to be technology mapped, the limited library of bricks (potentially derived for a specific application-domain) and a set of design constraints that describe the area as well as delay goals. The input Boolean network might be one that is obtained from the register transfer level (RTL) description of a circuit after performing some technology independent optimization. This Boolean network is then technology mapped via decomposition and recomposition to bricks, as described hereinafter, following the design constraints and specifications.

One aspect of the uniqueness of the present invention is that each cell and its precise characteristics are considered while performing logic synthesis. This is not possible during decomposition to standard cells due to the small cell sizes and the overwhelmingly complex number of possible decompositions due to the number of unique logic cells.

Since bricks are by definition dominated by large complex cells (cells with at least 3 inputs and 3 levels of internal logic depth as defined in the utility patent application incorporated by reference herein), the present invention does not use tree or DAG (directed acyclic graph) matching. Instead, during logic decomposition, decompositions are chosen for which the logic functions match a cell or brick in the library, as shown in the flow diagram of FIG. 3.

The present invention continues iteratively by decomposing any un-decomposed logic, and backtracking as necessary until all logic is decomposed into large function bricks and a few selected logic brick primitives (where percentage of cells that are simple primitives is typically no more than 15% of the total number of cells/bricks). The invention further considers that decomposition is coupled with re-composition moves. Logic recomposition is the opposite of decomposition, during which nodes in the multilevel network are collapsed into their respective fanout nodes. Logic recomposition/collapse is the process of eliminating factors from a network usually resulting in an increase in complexity of nodes in the network. This creates an opportunity for which more efficient decompositions can be discovered. In the university software tool SIS, (See SIS: A System for Sequential Circuit Synthesis. Robert K. Brayton Alberto Sangiovanni-Vincentelli et. al, EECS, University of California, Berkeley), recomposition (termed as eliminate) is driven by a maximum increase in the number of (user specified) literals in the network. The number of literals has been shown to roughly represent the complexity of a Boolean network. For example in U.S. Pat. No. 6,958,545 the recomposition moves are chosen in order to minimize congestion during the physical synthesis (the process of implementing the mask for a circuit netlist including buffer insertion and minor logic changes to accommodate for design constraints). An aspect of the present invention with respect to recomposition is that the following two types of sub-networks are considered for recomposition:

1. Sub-networks that match a cell or brick in the library, including the large complex bricks that are not found in standard cell libraries. This is achieved by structural or Boolean matching.
2. Sub-networks that are heuristically estimated to be efficiently decomposable into cells/bricks after re-composition.

Figure 3:
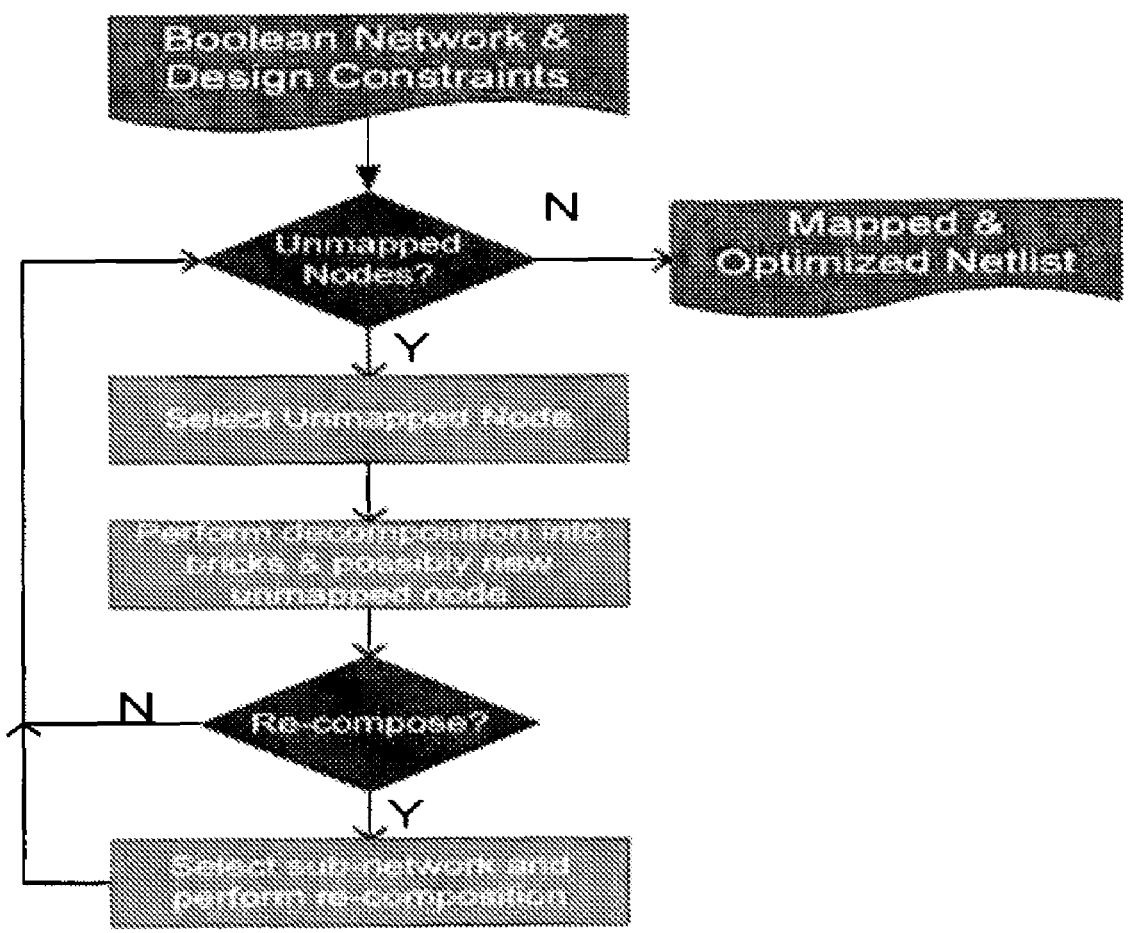
FIG. 3 illustrates a flowchart of the direct brick mapping according to the present invention.

FIG. 3 highlights the mapping flow according to the present invention, including the decomposition and recomposition.

Figure 4:
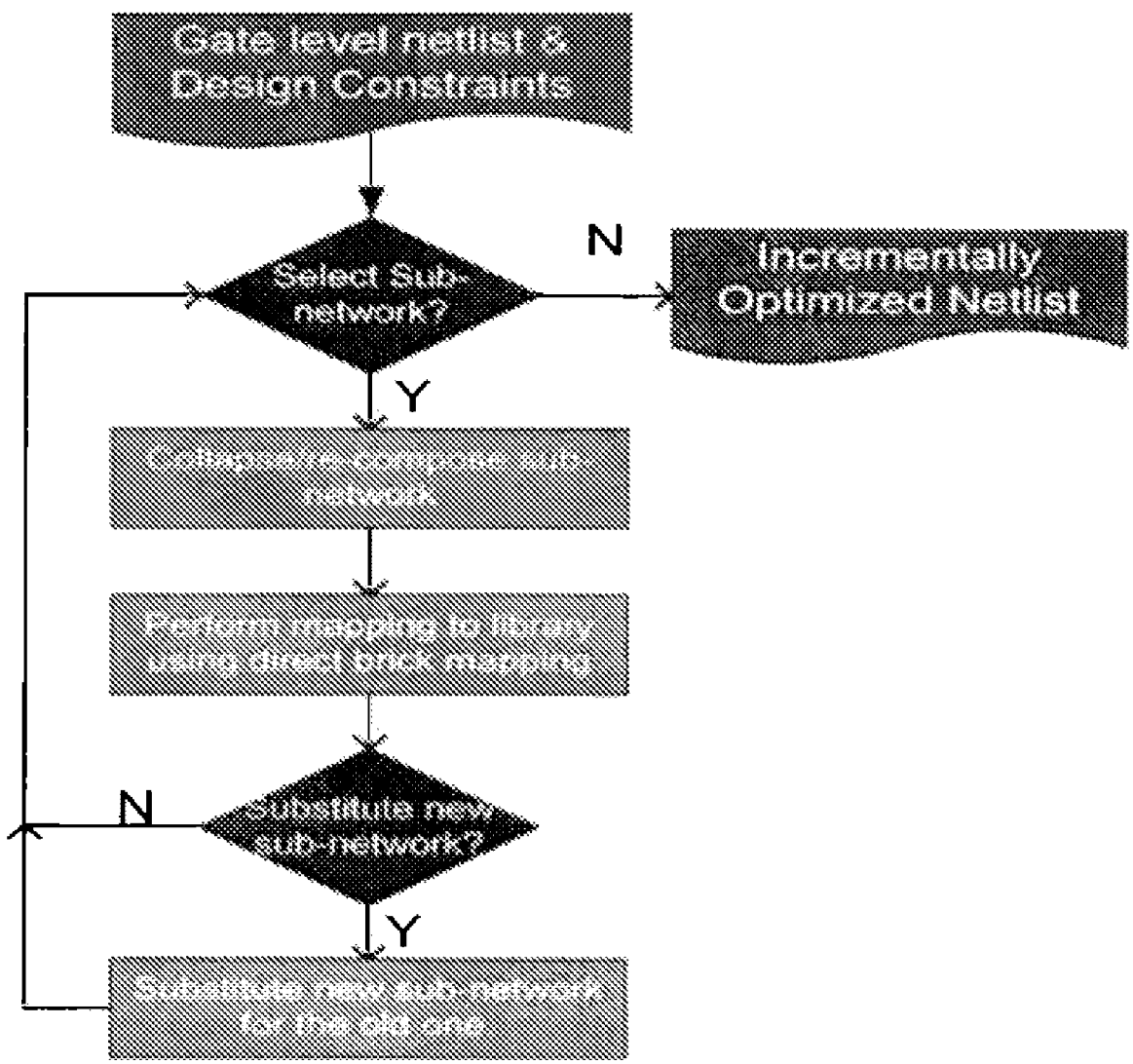
FIG. 4 illustrates a flow diagram for incremental netlist optimization according to the present invention.

An important aspect of this invention is that the cost function for the logic decomposition and optimization are measured in part by:

Placement information (if applied during physical synthesis)
Wireload estimates (when applied during frontend synthesis)→statistical wireloads
Timing, area and power characteristics of the bricks The present invention has the following properties that contribute to its novelty:

1. A method to directly transform an RTL/Unmapped Boolean network into a technology-specific design representation that is defined by a library of 5 to 50 cells (brick), with 85% or more of those cells corresponding to large complex logic functions of at least 3 inputs and at least 3 levels of logic. An unmapped Boolean network is a Boolean network where the implementation of nodes in a specific technology is not defined. The functionality of each node is defined abstractly. e.g. using the sum of products form.
2. A method to directly transform an RTL/Unmapped Boolean network into a cell (brick) level Boolean network based on a target cell (brick) library using Boolean decomposition.
3. The method in 2 for which the direct mapping further facilitates the optimization of specific attributes (e.g. Area, Delay, Power) during decomposition that would otherwise be impractical with a larger library.
4. The RTL/Unmapped Boolean network described in 1 might have been obtained in any of the following ways
   a. Human designed
   b. Logic collapsed/re-composed from a gate level implementation which might have undergone logic synthesis and/or physical synthesis
   c. Created via behavioral synthesis
5. The target brick library in 1 contains characterization data for the bricks that provides metrics for the targeted design attributes in 1. This data can also be derived during the processes described in the present invention using the process for transistor-level optimization described in the provisional application incorporated be reference herein. The Boolean functions of the bricks are derived as described in the utility application incorporated by reference herein.
6. The transformation in 1 is performed by iteratively using the following procedures, of which at least one takes the target brick library into account:
   a. Decomposition of nodes in the Boolean network
   b. Re-composition of nodes in the Boolean network
7. The decomposition in 6.a computes the cost function of various potential decomposition choices and performs the decomposition using the best choice. The cost function calculation uses the data in the target brick library using one of the following methods:
   a. Heuristic (Area and/or delay and/or power) estimation of the composition and/or the decomposition function when it is fully or partially implemented by the cells in the target library. A decomposition function is a candidate Boolean function (factor) that may be added to the network during decomposition.
   b. Exact (Area and/or delay and/or power) computation by recursively implementing the composition and/or decomposition function using the method in 1.
   c. Exact (Area and/or delay and/or power) computation by matching the composition and/or decomposition function to a brick in the target Brick library.
Further, the decomposition can be of type disjoint or non-disjoint.
8. The decomposition in 7 also considers the possibility of sharing the decomposition functions (Bricks from the target brick library) as factors among multiple Boolean nodes in the network.
9. Re-composition in 6.b evaluates the re-composition choices at a node and performs re-composition using the best choice. The cost function calculation takes the target brick library into account by calculating the cost function of the resulting collapsed Boolean function in one of the following ways:
   a. Heuristic (Area and/or delay and/or power) estimation of the collapsed function when it is fully or partially implemented by the cells in the target library.
   b. Exact (Area and/or delay and/or power) computation by recursively implementing the collapsed function using the method in 1.
   c. Exact (Area and/or delay and/or power) computation by matching the collapsed function to a Brick in the target Brick library.
10. The transformation procedure in 1 can be applied in the context of incremental optimization of a netlist. This can be done by selectively highlighting a sub-network and then remapping it using the procedure in 1. A flow-chart of this process is shown in FIG. 4.
11. The process in 9 can be applied to perform incremental optimization on the gate level netlist after some physical prototyping or full physical synthesis. In this case the cost function in 7 & 8 are evaluated using the information from the physical prototype/implementation, e.g. placement co-ordinates, wire loads, etc.

The following illustrates certain particular aspects of the mapping process that are unique in the context of the present invention.

A behavioral, RTL or an unmapped Boolean network is technology mapped to the small library of logic brick components (containing the set of complex functions and the set of simple functions, with the set of complex functions being the non-standard complex Boolean logic functions) using aggressive Boolean operations. Unmapped Boolean functions in the Boolean network are tested against each Brick in the Brick library for Boolean factoring. One way to test for factors is via Boolean division. In this manner, the Boolean network is technology mapped by directly mapping Boolean factors of the nodes in the Boolean network to complex Bricks that correspond to complex, non-traditional logic functions. Such aggressive Boolean operations would be of impractical runtime complexity for a large library. In contrast, existing methods (e.g. SIS: A System for Sequential Circuit Synthesis. Robert K. Brayton Alberto Sangiovanni-Vincentelli et. al, EECS, University of California, Berkeley) employ algebraic factoring or weak division during the technology independent stage prior to technology mapping to reduce the complexity of the Boolean network before mapping the network to a standard cell library.

Figure 5:
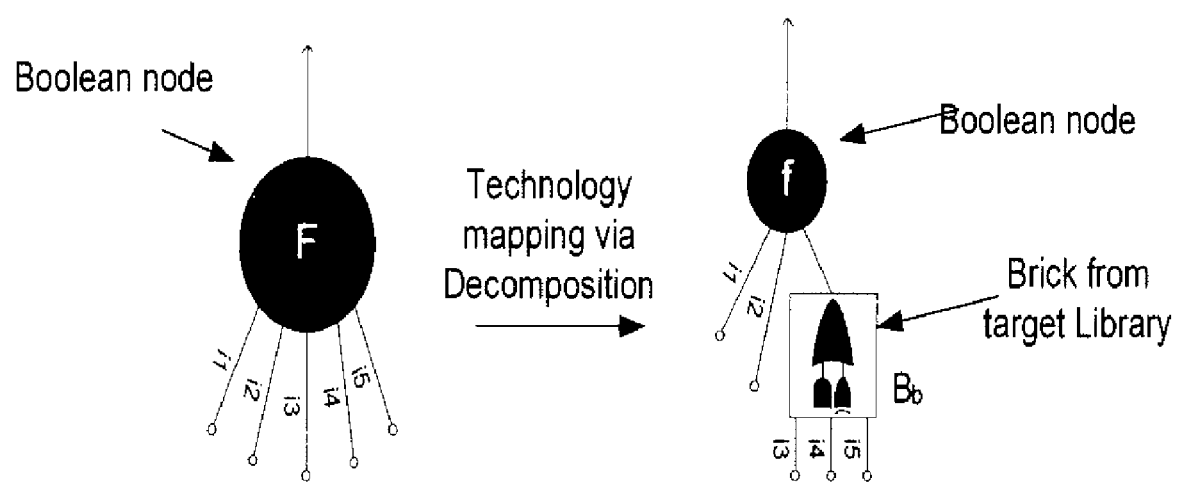
FIG. 5 illustrates decomposition of a node according to the present invention.

Referring to FIG. 3, each unmapped node in the Boolean network is mapped to bricks until all the nodes in the network get mapped. For example, referring to FIG. 5, we can consider starting with a Boolean function F (of an unmapped node) being technology mapped and derive all the support-reducing bound-sets (Is) of F, where the cardinality of each bound-set is less than N (N is the maximum number of inputs for any cell in the target brick library). Next, each brick in the target library is evaluated using each bound-set in Is to evaluate a cost function.

The cost function can be designed to achieve a certain area-timing and/or power tradeoff. The brick, Bb, that minimizes the cost function is chosen to decompose F (See FIG. 5) into a network that has a Boolean function f being driven by the brick Bb. An example of a cost function that can be used to optimize the area of the mapped circuit:

$$C = M(f) + \alpha \times area(Bb)$$

where, M(f) is the number of literals in the minimized SOP (sum-of-products) form of the composition function (f). The composition function is a Boolean function which represents the decomposed node in terms of the decomposition functions (factors). The minimization can be carried out by a literal based minimization tool such as Espresso (See SIS: A System for Sequential Circuit Synthesis. Robert K. Brayton Alberto Sangiovanni-Vincentelli et. al, EECS, University of California, Berkeley). The area(Bb) is the area foot-print of the brick B. The normalization factor (a) depends on the actual area foot-prints of cells in the target brick library.

Another example of a cost function which trades-off between area and delay is:

$$C = M(f) + \_\alpha \times area(B) + \beta\_ \times Max(Criticality(X1))$$

here, X1 is the set of pins in the bound set. The criticality of a pin is defined as the minimum slack that each input has with respect to some output. The weighting factors $\alpha$ and $\beta$ are adjusted for trading-off timing and area. The cost function biases the algorithm towards the selection of bricks with bound set inputs that are not critical.

In order to further optimize for area, we perform logic sharing (factoring) of the decomposition functions (Bricks) as follows. While evaluating the cost function during the selection of a brick, Bb, during decomposition of node F, other nodes in the neighborhood of F area considered for decomposition using the same brick. The selection of bricks which can form factors, as opposed to decompositions, is biased by the cost function for area.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated.

What is claimed is:
1. A method of mapping a system-level description of an integrated circuit, said system-level description comprising a behavioral, RTL or unmapped Boolean network, to a cell-level netlist description of the integrated circuit, said cell-level netlist description comprising a network of interconnected logic components selected from a small library of logic components having no more than 50 unique logic functions, the method comprising the steps of:

obtaining the behavioral, RTL or unmapped Boolean network that describes the integrated circuit using a computer system;

identifying the small library of logic components having no more than 50 unique logic functions, from which the components of the cell-level netlist description of the integrated circuit will be selected using the computer system, the small library of logic components including a set of complex functions and a set of simple functions, wherein the set of complex functions includes a plurality of non-standard complex Boolean logic functions and wherein substantially all of the plurality of non-standard complex Boolean logic functions each have at least three inputs; and mapping the network using the computer system to the small library of logic functions by directly mapping large functions from the network to different ones of the non-standard complex Boolean logic functions, wherein said direct mapping includes testing said unmapped functions against each complex function in the library using at least one of Boolean factoring and Boolean division, and wherein most of the network is mapped to certain ones of the plurality of non-standard complex Boolean logic functions.

2. The method according to claim 1 wherein the step of mapping further includes the steps of:
   decomposing other functions from the network;
   subsequently recomposing other large functions using the decomposed other functions; and
   further mapping at least some of the recomposed large functions directly to different ones of the non-standard complex Boolean logic functions.

3. The method according to claim 1 wherein the step of mapping maps functions from the network that do not correspond to the non-standard complex Boolean logic functions using the simple functions from the small library.

4. The method according to claim 1 wherein the logic decomposition in the step of mapping uses a cost function.

5. The method according to claim 4 wherein the cost function is affected by placement information.

6. The method according to claim 4 wherein the cost function is affected by wireload estimates.

7. The method according to claim 4 wherein the cost function is affected by at least one of timing, area and power characteristics of each of the non-standard complex Boolean logic functions.

* * * * *